United States Patent
Suzuki

(10) Patent No.: US 6,725,537 B2
(45) Date of Patent: Apr. 27, 2004

(54) METHOD OF CONNECTING CIRCUIT ELEMENT

(75) Inventor: Koji Suzuki, Aichi (JP)

(73) Assignee: Kabushiki Kaisha Tokai Rika Denki Seisakusho, Aichi (JP)

(*) Notice: Subject to any disclaimer, the term of this patent is extended or adjusted under 35 U.S.C. 154(b) by 0 days.

(21) Appl. No.: 09/768,553

(22) Filed: Jan. 25, 2001

(65) Prior Publication Data

US 2001/0012800 A1 Aug. 9, 2001

(30) Foreign Application Priority Data

Feb. 1, 2000 (JP) .................................... P.2000-023962

(51) Int. Cl.⁷ ................................................ H05K 3/30
(52) U.S. Cl. .............................. 29/837; 29/838; 29/844; 29/845; 29/853; 29/854
(58) Field of Search .......................... 29/837, 845, 879, 29/843, 882, 853, 854, 520, 838, 839, 844, 861, 862, 863, 883; 403/279, 280, 282; 228/173.6, 180.1, 234.2

(56) References Cited

U.S. PATENT DOCUMENTS

| | | | | |
|---|---|---|---|---|
| 3,605,244 A | * | 9/1971 | Osbrne et al. | 29/471.1 |
| 3,750,278 A | * | 8/1973 | Baker et al. | 29/628 |
| 3,934,327 A | * | 1/1976 | Hafner | 29/432 |
| 4,059,897 A | * | 11/1977 | Marquis | 29/432.1 |
| 4,073,561 A | * | 2/1978 | Baranowski | 339/112 R |
| 4,111,029 A | * | 9/1978 | Dulaquais | 72/342 |
| 4,458,414 A | * | 7/1984 | Aulman et al. | 29/882 |
| 5,082,460 A | * | 1/1992 | Legrady | 439/741 |
| 5,083,362 A | * | 1/1992 | Edgar et al. | 29/509 |
| 5,192,995 A | * | 3/1993 | Yamazaki et al. | 29/52 |
| 5,497,546 A | * | 3/1996 | Kubo et al. | 29/843 |
| 5,579,568 A | * | 12/1996 | Hudson et al. | 29/509 |
| 5,692,294 A | * | 12/1997 | Casey | 29/753 |
| 5,759,055 A | * | 6/1998 | Colantuano et al. | 439/287 |
| 5,861,577 A | * | 1/1999 | Tamura et al. | 174/50.56 |
| 6,256,879 B1 | * | 7/2001 | Neidich et al. | 29/843 |
| 6,276,040 B1 | * | 8/2001 | Muller | 29/432.2 |
| 2001/0012800 A1 | * | 8/2001 | Suzuki | 463/36 |

FOREIGN PATENT DOCUMENTS

| | | | | |
|---|---|---|---|---|
| JP | 5-63357 | * | 3/1993 | 29/829 |
| JP | 5-290666 | * | 11/1993 | 29/876 |
| JP | 2000-251979 | * | 9/2000 | |

* cited by examiner

*Primary Examiner*—Carl J. Arbes
*Assistant Examiner*—Minh Trinh
(74) *Attorney, Agent, or Firm*—Morgan, Lewis & Bockius LLP

(57) ABSTRACT

A contact of a circuit element is fixed to a terminal of a metallic plate by plastically deforming a portion of the terminal against the contact. The method of connecting the contact to a terminal includes forming a contact through-hole in the terminal, and inserting the contact into the contact through-hole. Next, a crushing punch plastically deforms a portion of the upper surface of the terminal adjacent the contact through-hole so that the terminal is connected to the contact.

6 Claims, 5 Drawing Sheets

METHOD OF CONNECTING CIRCUIT ELEMENT

BACKGROUND OF THE INVENTION

1. Technical Field

This invention relates to a method of connecting a circuit element which connects the contact of the circuit element to a terminal of a metallic plate.

2. Related Art

A known method of connecting the contact of the circuit element to the terminal of the metallic plate is to insert the contact into a contact through-hole formed in the terminal and connect the contact and the terminal mechanically and electrically by soldering. Another known method is to connect the contact and terminal mechanically and electrically by "resistance joining" in which the contact is pressure-welded to the terminal and a current is passed therebetween in this state so that they are deposited to each other by Joule heat.

The former technique has a disadvantage that it takes a long time for the soldering and produces toxic wastes during the soldering.

The latter technique has a disadvantage that it requires a troublesome operation of setting/adjusting a current value and pressure during the pressure welding.

SUMMARY OF THE INVENTION

This invention has been accomplished in view of the circumstance described above. An object of this invention is to provide a method of connecting a circuit element which takes a short time for connection and can avoid a troublesome operation of setting/adjusting a current value and pressure.

The method according to the invention is characterized, in order to connect a contact of a circuit element to a terminal of a metallic plate, by comprising the steps of:

forming a contact through-hole in the terminal;
inserting the contact into the contact through-hole; and
plastically deforming a vicinity of the contact through-hole so that the terminal is connected to the contact.

In this method, since the terminal is plastically deformed so that it is connected to the contact of the circuit element, it does not take a long time for connection. In addition, a troublesome operation of setting/adjusting a current value and pressure is not required, and the connection can be made easily for a short time.

In this case, with respect to the above plastic deformation, the vicinity of the contact through-hole in the terminal may be deformed using a crushing punch, or otherwise may be plastically deformed toward the contact using a punch having a slanted tip surface.

The method according to the invention is characterized, in order to connect a contact of a circuit element to a terminal of a metallic plate, by comprising the steps of:

forming a contact through-hole in the terminal;
arranging the terminal on a receiving portion so that a vicinity of the contact through-hole is supported by the receiving portion;
inserting the contact into the contact through-hole; and
crashing the vicinity of the contact through-hole by a crushing punch so that the terminal is connected to the contact.

DESCRIPTION OF PREFERRED EMBODIMENTS

Figure 1:
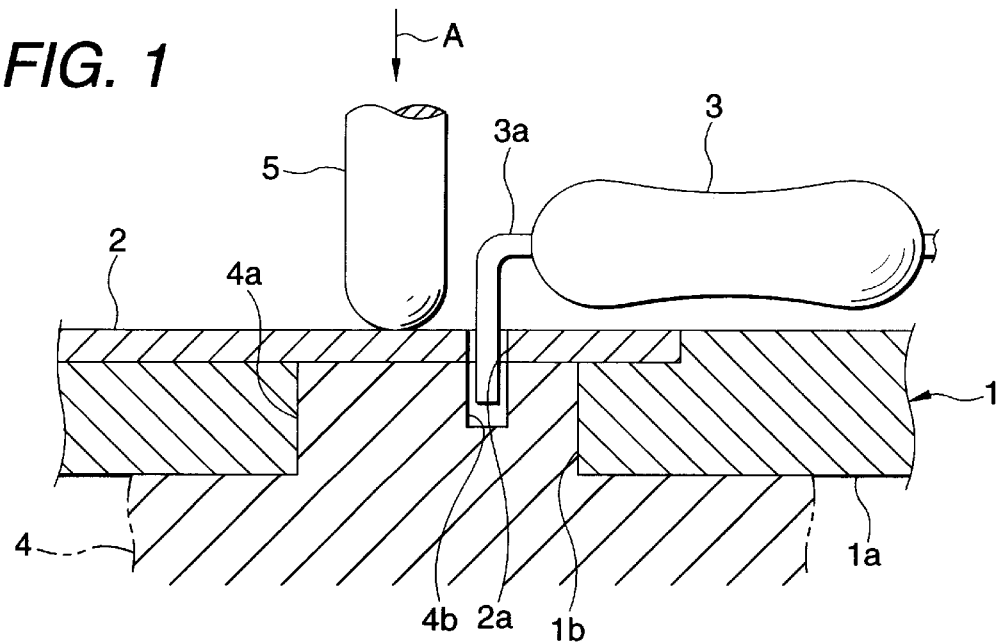
FIG. 1 is a vertically sectional side view showing a state on the way of manufacture of a first embodiment of the invention.
Figure 2:
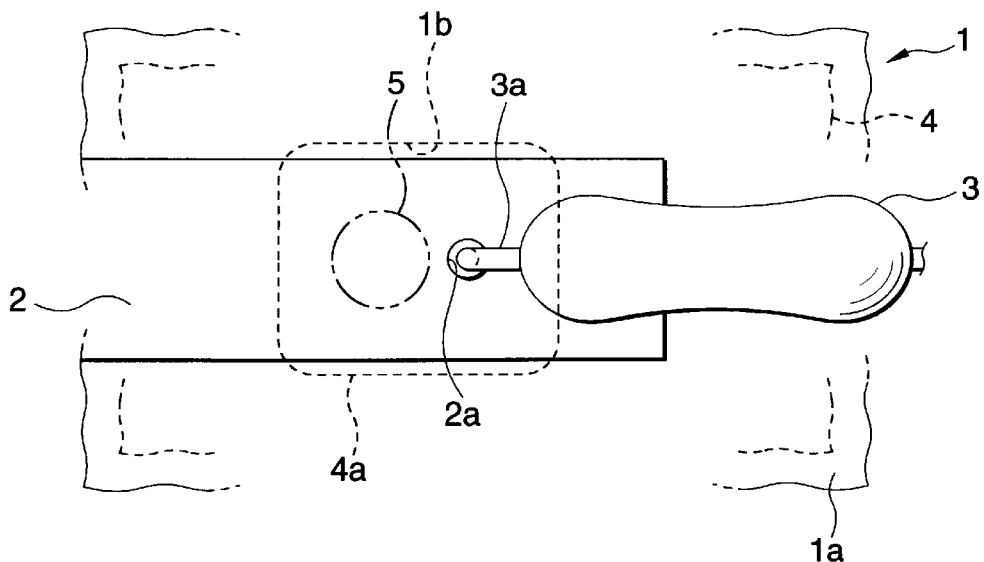
FIG. 2 is a plan view of the state.
Figure 3:
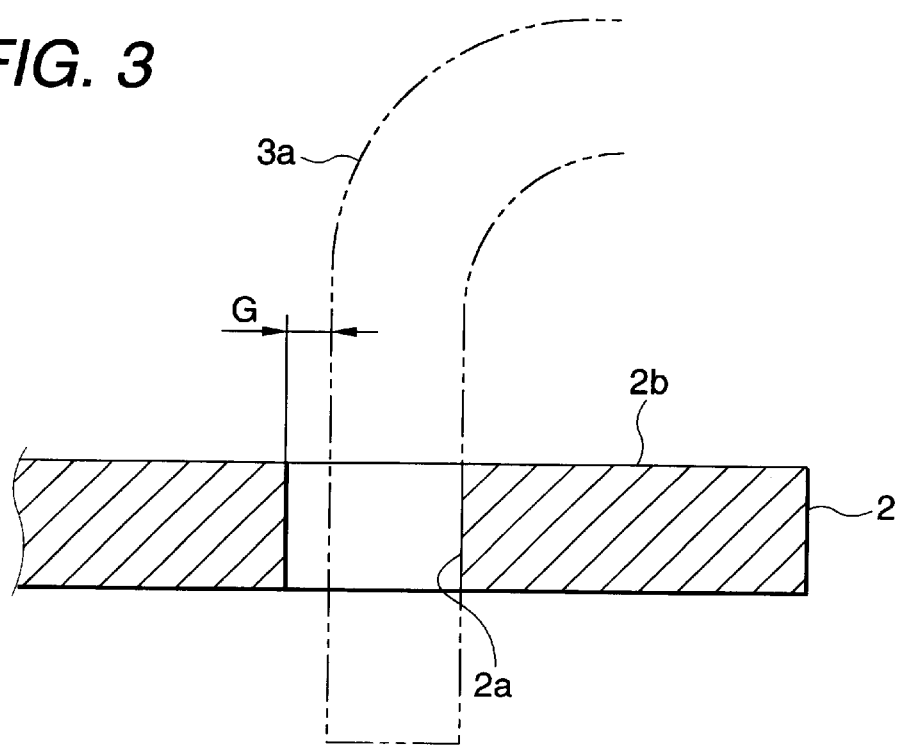
FIG. 3 is an enlarged vertically sectional side view of a terminal.
Figure 4:
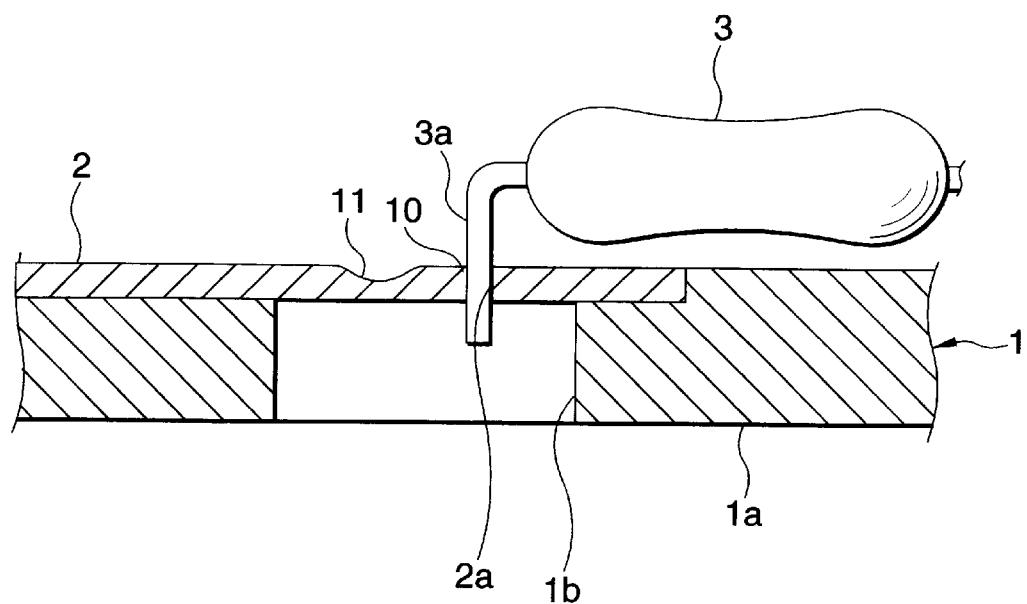
FIG. 4 is a vertically sectional side view showing the state after connection.

Now referring to FIGS. 1 to 4, an explanation will be given of an embodiment of this invention. FIG. 4 shows the state where a contact 3a of a resistor 3 as a circuit element is connected to a terminal 2 of a circuit board 1. In FIGS. 1 and 2 showing the former state of such a connection, as for the circuit board 1, the terminal 2 of a thin metallic plate (e.g. a copper plate having a thickness of 0.64 mm) is fixed to a board body 1a of an electrically insulating material. The terminal 2 has a contact through-hole 2a. The board body 1 has a large hole area 1b for arranging a receiving part in an area corresponding to the terminal through-hole 2a. The terminal 2 is covered with an oxidation preventing (passivation) film 2b (e.g. tinning) as shown in FIG. 3. The oxidation preventing film 2b is formed after the contact through-hole 2a is formed. Therefore, the oxidation preventing film 2b is also formed on the inner surface of the contact through-hole 2a. A gap G between the inner surface of the contact through-hole 2a and the contact 3a (FIG. 3) is preferably 0.1–0.3 mm.

In order to connect the terminal 2 to the contact 3a, as shown in FIGS. 1 and 2, the board 1 is arranged so that the hole area 1b is fit over the receiving portion 4a which is a convex portion of a receiving die 4. At this time, the upper surface of the receiving portion 4a is adapted to receive the lower surface of the edge of the contact through-hole 2a. The receiving portion 4a has a contact clearance concave portion 4b at the position corresponding to the contact through-hole 2a. The contact 3a of the resistor 3 is inserted into the contact through-hole 2a.

Thereafter, the vicinity of the terminal through-hole 2a in the terminal 2 is crushed by a crushing punch 5 which is moved for pressing in a direction of arrow A, and plastically deformed as shown in FIG. 4, that is, a concave portion 11 is formed on the vicinity of the terminal through-hole 2a by a crushing punch 5. In this deforming process, since receiving portion 4a prevents the terminal 2 from projecting in the direction of the arrow A, the energy generated by the deforming process can not be consumed by forming a deformation in the direction of the arrow A. Therefore, the energy goes toward the terminal through-hole 2a and is consumed by forming a convex contact portion 10 projected from a part of the contact through-hole 2a. So that the terminal 2 is mechanically and electrically connected to the contact 3a. Thereafter, the receiving die 4 is taken off.

In accordance with this embodiment, since the terminal 2 is plastically deformed so that it is connected to the contact 3a of the resistor 2, it does not take a longtime for connection. In addition, a troublesome operation of setting/adjusting a current value and pressure is not required, and the connection can be made easily for a short time.

Particularly, in accordance with this embodiment, since the vicinity of the contact through-hole 2a in the terminal 2 is crushed by a crushing punch 5 so that it is plastically deformed, the stroke of the crushing punch 5 has only to be controlled to make the plastic deformation which is appropriate for connection, thereby making sure connection in a simple step.

Since the outer surface of the terminal 2 inclusive of the inner surface of the contact through-hole 2a is covered with the passivation film 2b, the oxidation at the connecting area between the contact 3a of the resistor 3 and the contact through-hole 2a can be surely prevented. Incidentally, some terminals have a contact through-hole after the passivation film has been formed. Such terminals have no passivation film on the inner surface of the contact through-hole. In this case, when soldering is adopted for connection, solder is filled in between the contact and the contact through-hole so that there is no fear of oxidation. On the other hand, like this embodiment, in a method of connecting the terminal 2 to the contact 3a not via the solder but directly, there is a fear of oxidation at the connecting portion. However, in accordance with this embodiment, since the outer surface of the terminal 2 inclusive of the inner surface of the contact through-hole is covered with the passivation film 2b, the oxidation at the connecting area between the contact 3a of the resistor 3 and the contact through-hole 2a can be surely prevented.

Figure 5:
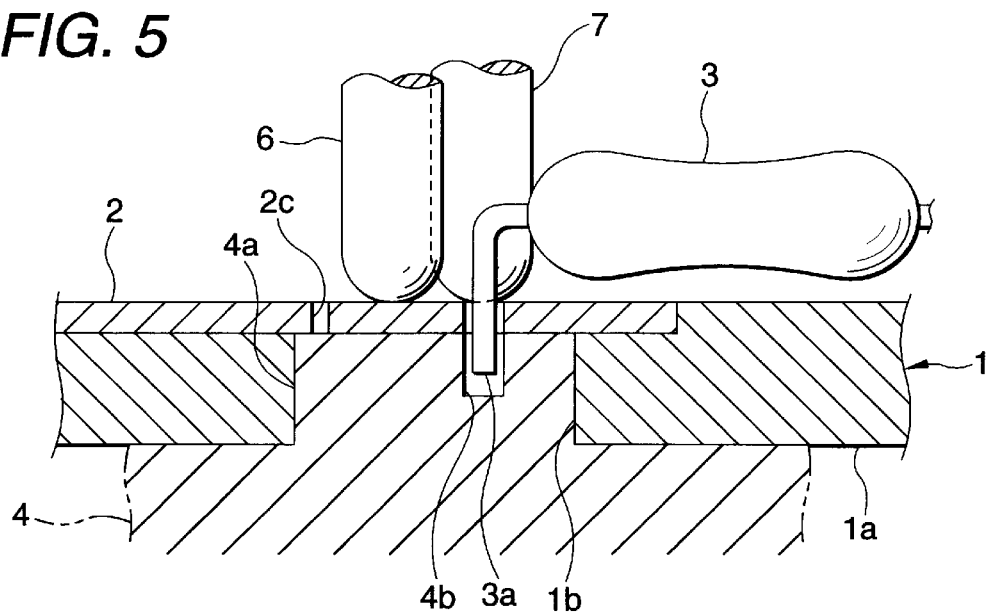
FIG. 5 is a view corresponding to FIG. 1 showing a second embodiment of the invention.
Figure 6:
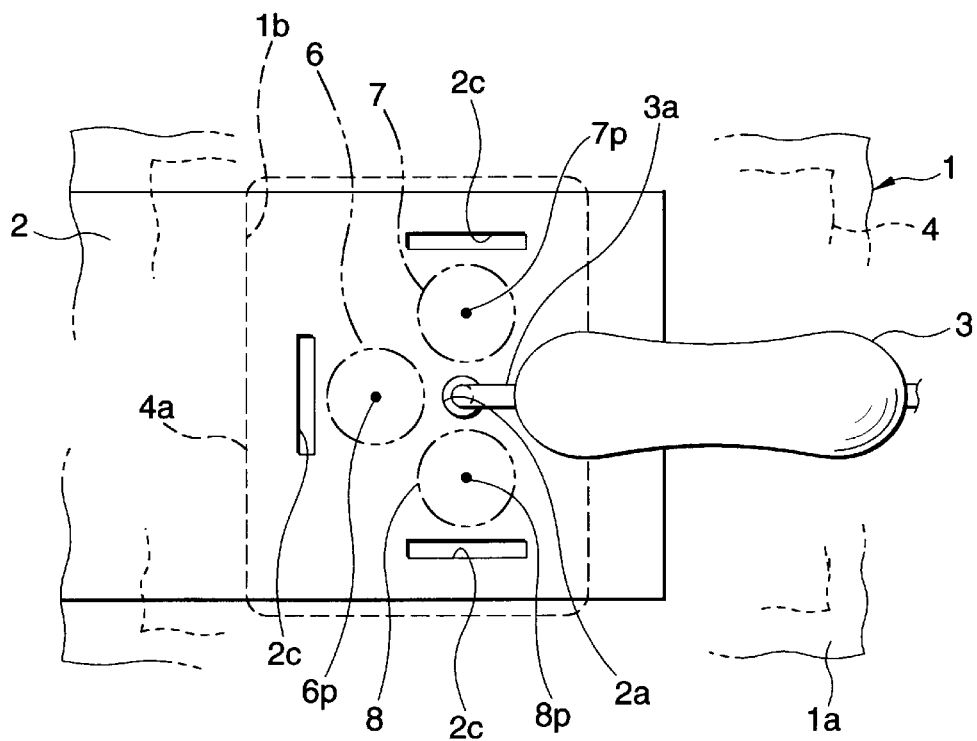
FIG. 6 is a view corresponding to FIG. 2 showing the second embodiment of the invention.

FIGS. 5 and 6 show the second embodiment of this invention. This embodiment is different from the first embodiment in the following point. In this embodiment, plural (e.g. three) punches 6, 7 and 8 are provided for punching the vicinity (periphery) of the contact through-hole 2a in the terminal 2 at plural (e.g. three) points. At the three points on the periphery of the contact through-hole 2a in the terminal 2 (the points on the side opposite to the contact through-hole 2a with respect to the pressing points 6p, 7p and 8p of the punches 6, 7 and 8), slit-like deformation clearance holes 2c, 2c, 2c are previously formed.

In this embodiment, the periphery of the contact through-hole 2a in the terminal 2 is crushed and deformed at three points by these punches 6, 7 and 8 so that the edge of the contact through-hole 2a is mechanically and electrically connected to the contact 3a. In this case, since the terminal 2 has deformation clearance slits 2c, 2c and 2c, the plastic deformation will not be extended to the outside of each slit.

In accordance with this embodiment, since the plural points on the periphery of the contact through-hole 2a in the terminal 2 are plastically deformed for connection to the contact 3a, sure and stiff connection can be realized. Incidentally, the deformation clearance slits 2c can be omitted. A single punch may be provide to press/crush the terminal at the plural points. The number of crushing points is not limited.

Figure 7:
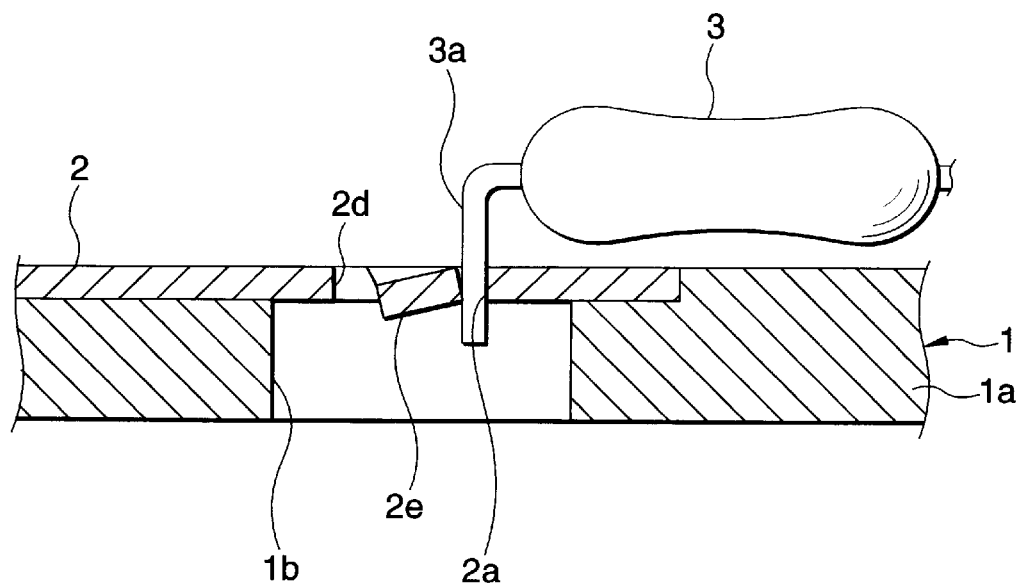
FIG. 7 is a view corresponding to FIG. 4 showing a third embodiment of the invention.
Figure 8:
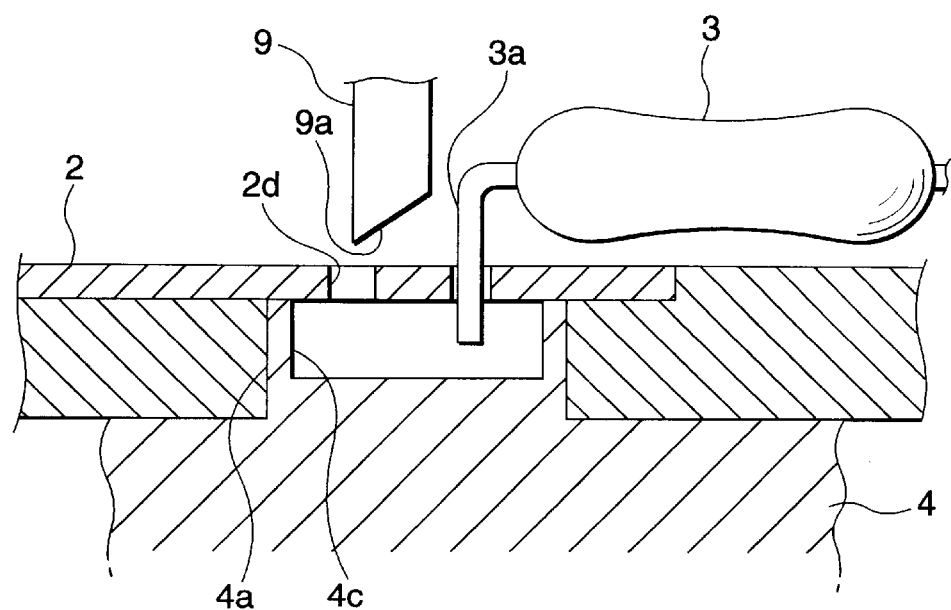
FIG. 8 is a view corresponding to FIG. 1 showing the third embodiment of the invention.
Figure 9:
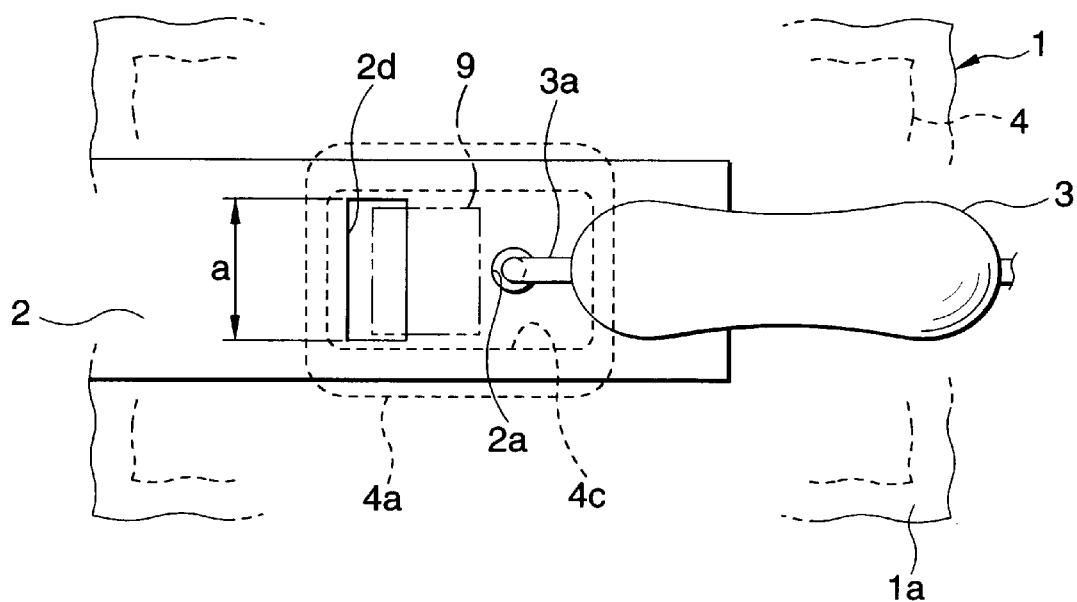
FIG. 9 is a view correspond to FIG. 2 showing the third embodiment of the invention.

FIGS. 7 to 9 show the third embodiment of this embodiment. This embodiment is different from the first embodiment in the following point. FIG. 7 shows the state where connection has been completed. FIGS. 8 and 9 show the state before connection. The terminal 2 has a punch contacting slit 2d having e.g. a square shape for facilitating the plastic deformation which is formed to align with the contact through-hole 2a. In this case, the punch 9 has a slanted tip, and the longitudinal width Wa of the punch contacting slit 2d is set to be slightly larger than that of the punch 9 (FIG. 9). Further, the receiving portion 4a of the receiving die 4 has a concave portion 4c for clearance of the punch and contact.

In order to connect the terminal 2 to the contact 3a, as shown in FIGS. 8 and 9, with the contact 3a inserted into the contact through-hole 2a, the punch 9 is caused to descend so that its slope 9a is brought into contact with the right edge of the punch contacting slit 2d (in the vicinity of the contact through-hole 2a). Then, this right edge is pressed down while it is compressed toward the contact so that it is plastically deformed. Thus, the terminal 2 is mechanically and electrically connected to the contact 3a. In FIG. 7, the plastically deformed portion is denoted by reference symbol 2e.

In accordance with this embodiment, the plastic deformation can be made comparatively easily. In addition, since the portion corresponding to the thickness of the terminal 2 is compressed toward the contact 2a, the contact 3a is brought into contact with this portion, thereby assuring the electric connection therebetween.

In the embodiments described above, the circuit element is a resistor as an example, but it may be a capacitor or any other discrete component.

As apparent from the description hitherto made, in the method of connecting a circuit element according to this invention, since the terminal 2 is plastically deformed so that it is connected to the contact of the circuit element, it does not take a long time for connection. In addition, a troublesome operation of setting/adjusting a current value and pressure is not required, and the connection between the terminal and the contact of the circuit element can be made easily for a short time.

What is claimed is:

1. A method of connecting a contact of a circuit element to a terminal of a metallic plate, the terminal having an upper surface, said method comprising the steps of:

forming a contact through-hole in the terminal;

forming an oxidation preventing film on the terminal after forming said contact through-hole;

inserting the contact into the contact through-hole after forming said oxidation preventing film on the terminal; and plastically deforming a portion of the upper surface adjacent the contact through-hole so that the terminal is electrically connected to the contact.

2. The method of connecting the contact to the terminal according to claim 1, wherein the step of plastically deforming is particularly performed by a crushing punch.

3. The method of connecting the contact to the terminal according to claim 2, wherein the crushing punch has a slanted tip surface.

4. The method of connecting the contact to the terminal according to claim 1 further comprising the step of:

forming a deformation clearance hole opposite to the contact through-hole with respect to a vicinity of the contact through-hole prior to said plastically deforming step.

5. The method of connecting the contact to the terminal according to claim 1, wherein plastically deforming includes deforming the portion of the upper surface such that the terminal deforms against the contact.

6. The method of connecting the contact to the terminal according to claim 1, wherein the difference between the inner diameter of the contact through-hole and the diameter of the contact is 0.1–0.3 mm.

* * * * *